United States Patent
Kumar et al.

(10) Patent No.: US 12,414,327 B2
(45) Date of Patent: Sep. 9, 2025

(54) LATERAL CONFINEMENT OF SOURCE DRAIN EPITAXIAL GROWTH IN NON-PLANAR TRANSISTOR FOR CELL HEIGHT SCALING

(71) Applicant: Intel Corporation, Santa Clara, CA (US)

(72) Inventors: Nitesh Kumar, Beaverton, OR (US); Mohammed Hasan, Aloha, OR (US); Vivek Thirtha, Portland, OR (US); Nikhil Mehta, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 916 days.

(21) Appl. No.: 17/359,440

(22) Filed: Jun. 25, 2021

(65) Prior Publication Data
US 2022/0416044 A1    Dec. 29, 2022

(51) Int. Cl.
*H10D 30/67* (2025.01)
*H10D 62/10* (2025.01)
*H10D 62/13* (2025.01)
*H10D 84/85* (2025.01)

(52) U.S. Cl.
CPC ..... *H10D 30/6735* (2025.01); *H10D 30/6757* (2025.01); *H10D 62/121* (2025.01); *H10D 62/151* (2025.01); *H10D 84/85* (2025.01)

(58) Field of Classification Search
None
See application file for complete search history.

(56) References Cited

U.S. PATENT DOCUMENTS

| | | | |
|---|---|---|---|
| 2014/0001572 A1* | 1/2014 | Bohr | H01L 27/0886 438/424 |
| 2021/0057535 A1 | 2/2021 | Chiang | |
| 2021/0098634 A1 | 4/2021 | Chung | |

OTHER PUBLICATIONS

Extended European Search Report for European Patent Application No. 22179006.6 mailed Nov. 18, 2022, 7 pgs.
Office Action for European Patent Application No. 22179006.6 mailed Dec. 9, 2024, 5 pgs.

* cited by examiner

*Primary Examiner* — Bo B Jang
(74) *Attorney, Agent, or Firm* — Schwabe, Williamson & Wyatt P.C.

(57) ABSTRACT

Gate-all-around integrated circuit structures having nanoribbon sub-fin isolation by backside Si substrate removal etch selective to source and drain epitaxy, are described. For example, an integrated circuit structure includes a plurality of horizontal nanowires above a sub-fin. A gate stack is over the plurality of nanowires and the sub-fin. Epitaxial source or drain structures are on opposite ends of the plurality of horizontal nanowires. The epitaxial growth occurs inside a mold confinement, and due the mold, the lateral wingspan of the wingspan of the epitaxial growth is limited. Also the mold causes the epitaxial source or drain structures to exhibit substantially vertical opposing sidewalls and a top surface having a generally mushroom shape over a top of a dielectric layer.

19 Claims, 14 Drawing Sheets

LATERAL CONFINEMENT OF SOURCE DRAIN EPITAXIAL GROWTH IN NON-PLANAR TRANSISTOR FOR CELL HEIGHT SCALING

TECHNICAL FIELD

Embodiments of the disclosure are in the field of integrated circuit structures and processing and, in particular, lateral confinement of source drain epitaxial growth in non-planar transistor for cell height scaling.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In another aspect, maintaining mobility improvement and short channel control as microelectronic device dimensions scale below the 10 nanometer (nm) node provides a challenge in device fabrication. Nanowires used to fabricate devices provide improved short channel control.

Scaling multi-gate and nanowire transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

BRIEF DESCRIPTION OF THE DRAWINGS

FIGS. 3F-1, 3F-2 and 3F-3 illustrate a TEM cross-sectional view of an integrated circuit structure having confined epitaxial source or drain structures due to the presence of the mold structure during fabrication.

DESCRIPTION OF THE EMBODIMENTS

Figure 2:
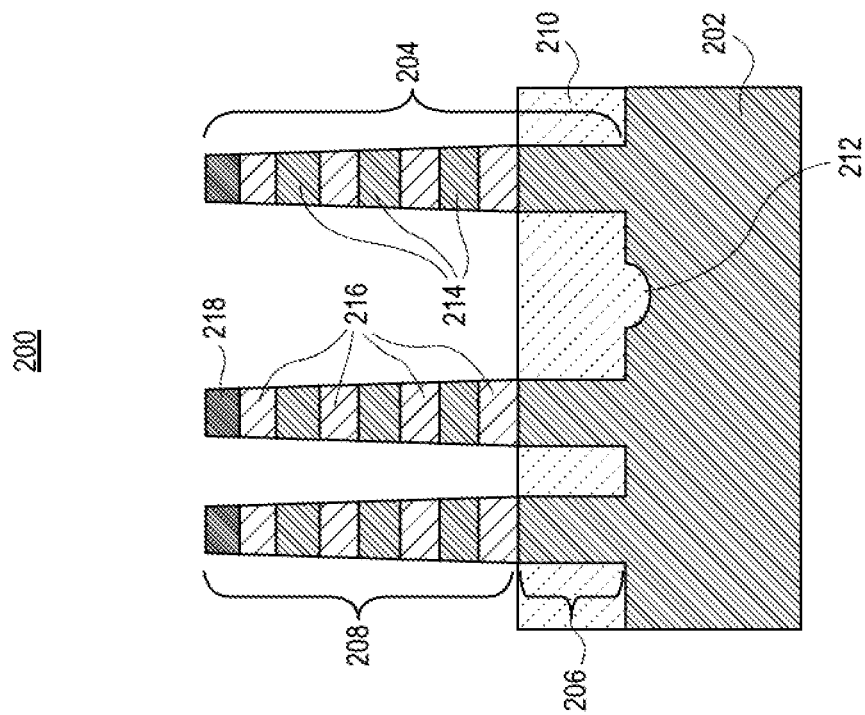
FIG. 2 illustrates a cross-sectional view of a nanowire or nanoribbon precursor structure.

Integrated circuit structures with confined source-drain epitaxial growth, and methods of fabricating scaled gate-all-around or FinFET integrated circuit structures by confining source-drain epitaxial growth, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back-end-of-line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to architectures and methods for fabricating integrated circuit structures having confined epitaxial source or drain structures. Embodiments include gate-all-around (GAA) integrated circuit and FinFET transistor architectures. The disclosed embodiments allow for growth of source/drain epitaxial film inside confinement of a mold structure to limit the wingspan of the resulting epitaxial source or drain structures. Confining the wingspan of the epitaxial source or drain structures will enable scaling, which results in increased transistor density.

One or more embodiments described herein are directed to fin engineering for the integrated flow of nanowire/nanoribbon (NW/NR) transistors, and the resulting devices. To provide context, epitaxial source or drain structures (EPI S/D) for nanowire transistors are isolated from an underlying substrate by design using a dielectric. Therefore, n-channel metal-oxide semiconductor (NMOS) and p-channel metal-oxide semiconductor (PMOS) can be isolated from one another merely by the separation of N-EPI and P-EPI, and a tall fin for isolation is not necessarily needed. This is different from planar FETs and FinFETs, where a shallow trench isolation (STI) is used for N/P isolation. In another embodiment, epitaxial source or drain structures (EPI S/D) for nanowire transistors can also be isolated from an underlying substrate by using a tall fin and shallow trench isolation, which is similar to planar FETs and FinFETs.

Figure 1:
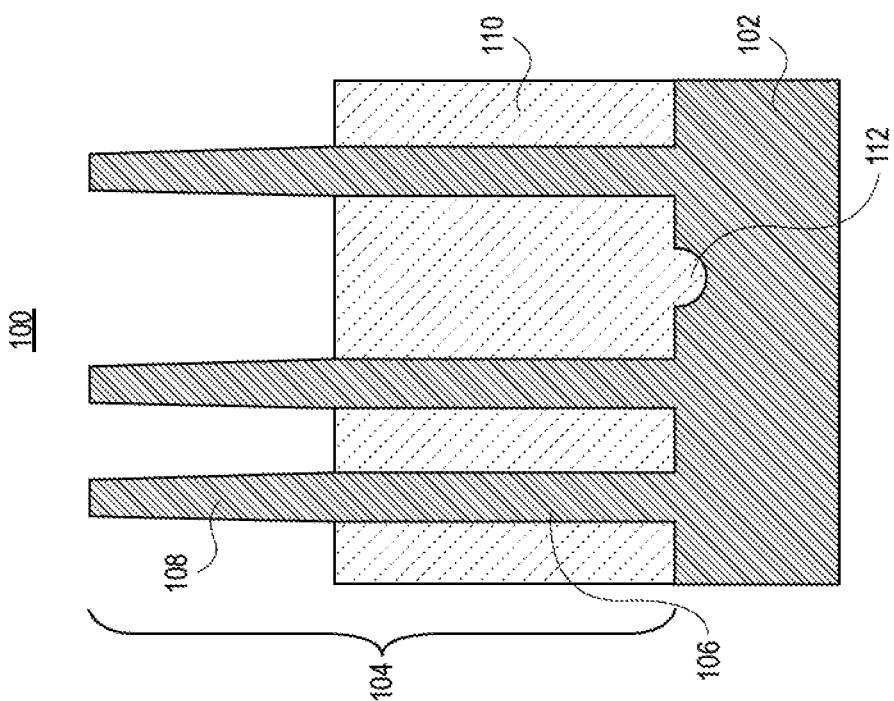
FIG. 1 illustrates a cross-sectional view of a finFET structure.

For comparative purposes, FIG. 1 illustrates a cross-sectional view of a finFET structure 100. FinFET structure 100 includes a plurality of fins 104 above and/or protruding from a substrate 102, such as a silicon substrate. Each fin 104 includes a subfin portion 106 and a protruding or active fin portion 108. An isolation structure 110 is between and adjacent to subfin portions 106 of the plurality of fins 104. It is to be appreciated that the plurality of fins 104 can include locations where individual fins have been removed, for example at location 112.

By contrast to FIG. 1, FIG. 2 illustrates a cross-sectional view of a nanowire or nanoribbon precursor structure 200. Referring to FIG. 2, nanowire or nanoribbon precursor structure 200 includes a plurality of fins 204 above and/or protruding from a substrate 202, such as a silicon substrate. Each fin 204 includes a subfin portion 206 and a protruding fin portion 208. An isolation structure 210 is between and adjacent to sub-fin portions 206 of the plurality of fins 204. It is to be appreciated that the plurality of fins 204 can include locations where individual fins have been removed, for example at location 212. Each of the protruding fin portions 208 includes a plurality of nanowires or nanoribbons 214 (e.g., silicon nanowires or nanoribbons). Unless stated specifically to the alternative, the terms nanowires and nanoribbons can be used interchangeably throughout this disclosure. Each of the protruding fin portions 208 also includes a sacrificial release layers 216, such as silicon germanium sacrificial release layers. In an embodiment, each of the protruding fin portions 208 also includes a capping dielectric layer 218, which can be included for fin protection, and may ultimately be retained or removed. The structure of FIG. 2 can be subjected to further processing, such as nanowire release (sacrificial layer removal), gate formation, spacer formation, and epitaxial source or drain formation.

While the nanowire precursor structure 200 has improved scaling compared to the finFET structure 100, both SRAM and logic cell height scaling for gate-all-around and finFET structures is limited by the spacings between N-N, P-P and N-P transistors due to the wingspan of source-drain epitaxial growth One or more embodiments described herein are directed to architectures and methods for fabricating gate-all-around or finFET integrated circuit structures having confined epitaxial source or drain structures for cell height scaling with customizable wingspans.

FIGS. 3A-3E illustrate fin cut cross-sectional views (top) and three-dimensional cross-sectional views (bottom) views of various operations in a method of fabricating an integrated circuit structure having confined epitaxial source or drain structures.

Figure 3A:
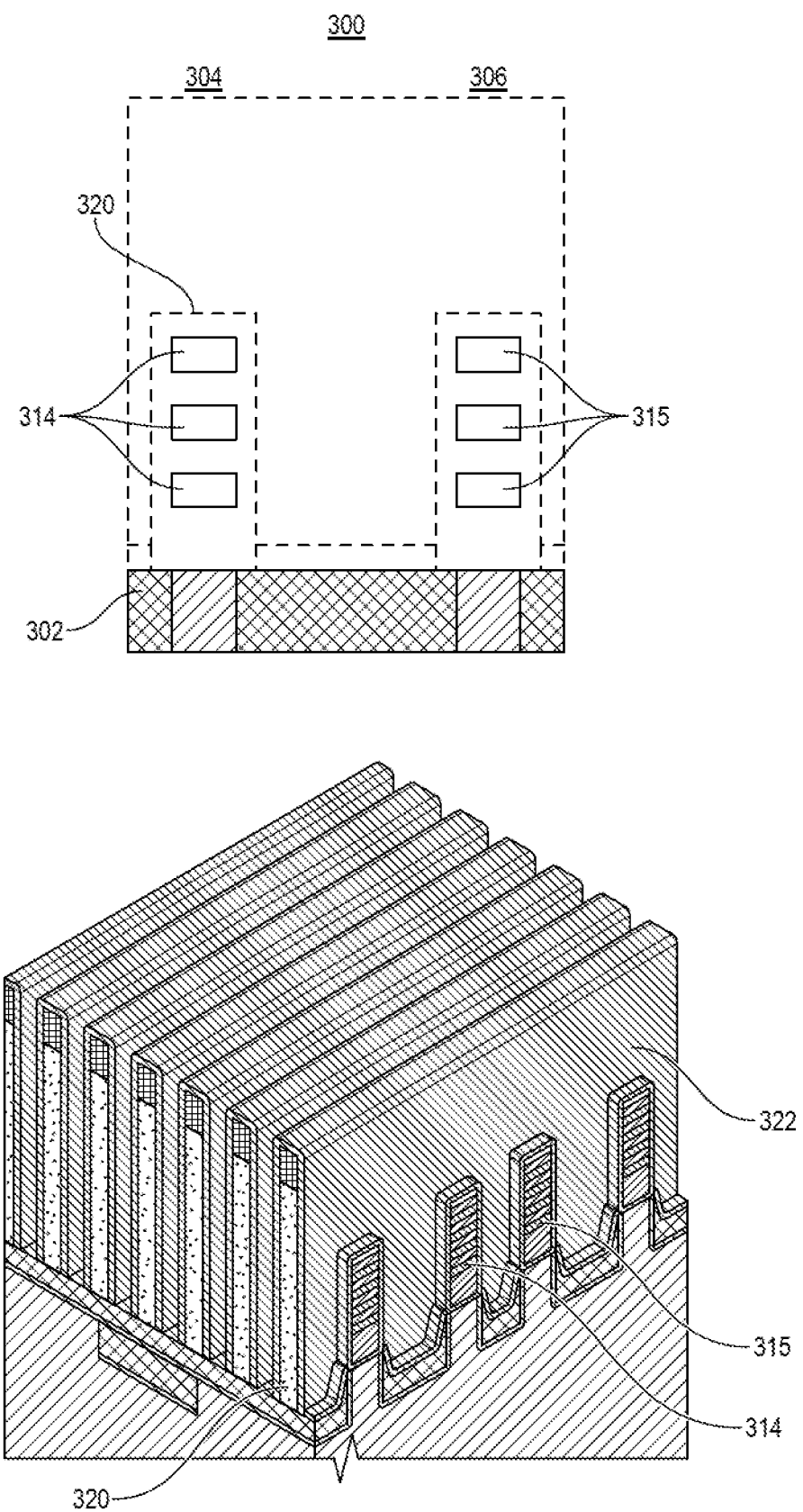
FIGS. 3A-3E illustrate fin cut cross-sectional views (top) and three-dimensional cross-sectional views (bottom) views of various operations in a method of fabricating an integrated circuit structure having confined epitaxial source or drain structures.

Referring to FIG. 3A, a starting integrated circuit structure 300 comprises a PMOS region 304 and an NMOS region 306 above a substrate 302. In embodiments, the integrated circuit structure 300 comprises a gate-all-around structure with a bottom dielectric, but the method is applicable to a gate all around transistor without a bottom dielectric and to non-planar devices such as, but not limited to, a finFET or a tri-gate device structure. The PMOS region 304 includes a first plurality of nanowires 314 (which can be nanoribbons) above a sub-fin of a substrate 302. The NMOS region 306 includes a second plurality of nanowires 315 (which can be nanoribbons) above a sub-fin of the substrate 302. A gate stack 320 (such as a gate electrode and gate dielectric stack) is over and surrounds the first plurality of nanowires 314 and the second plurality of nanowires 315. In embodiments, the gate stack 320 may be a dummy gate stack and the gate stack over the first plurality of nanowires 314 may be different or the same as the gate stack over the second plurality of nanowires 315.

A gate spacer 322 is conformally deposited over and on either side of the first and second gate stacks 320 as shown. The gate spacer 322 may comprise external gate spacers and internal gate spacers, where the external gate spacers are above the internal gate spacers. Optionally, spacer extensions (not shown) can be included at locations between the epitaxial source or drain structures and the substrate 302. The spacer extensions can be continuous with or discrete from the internal gate spacers, and the internal gate spacers can be continuous with or discrete from the external gate spacers.

Figure 3B:
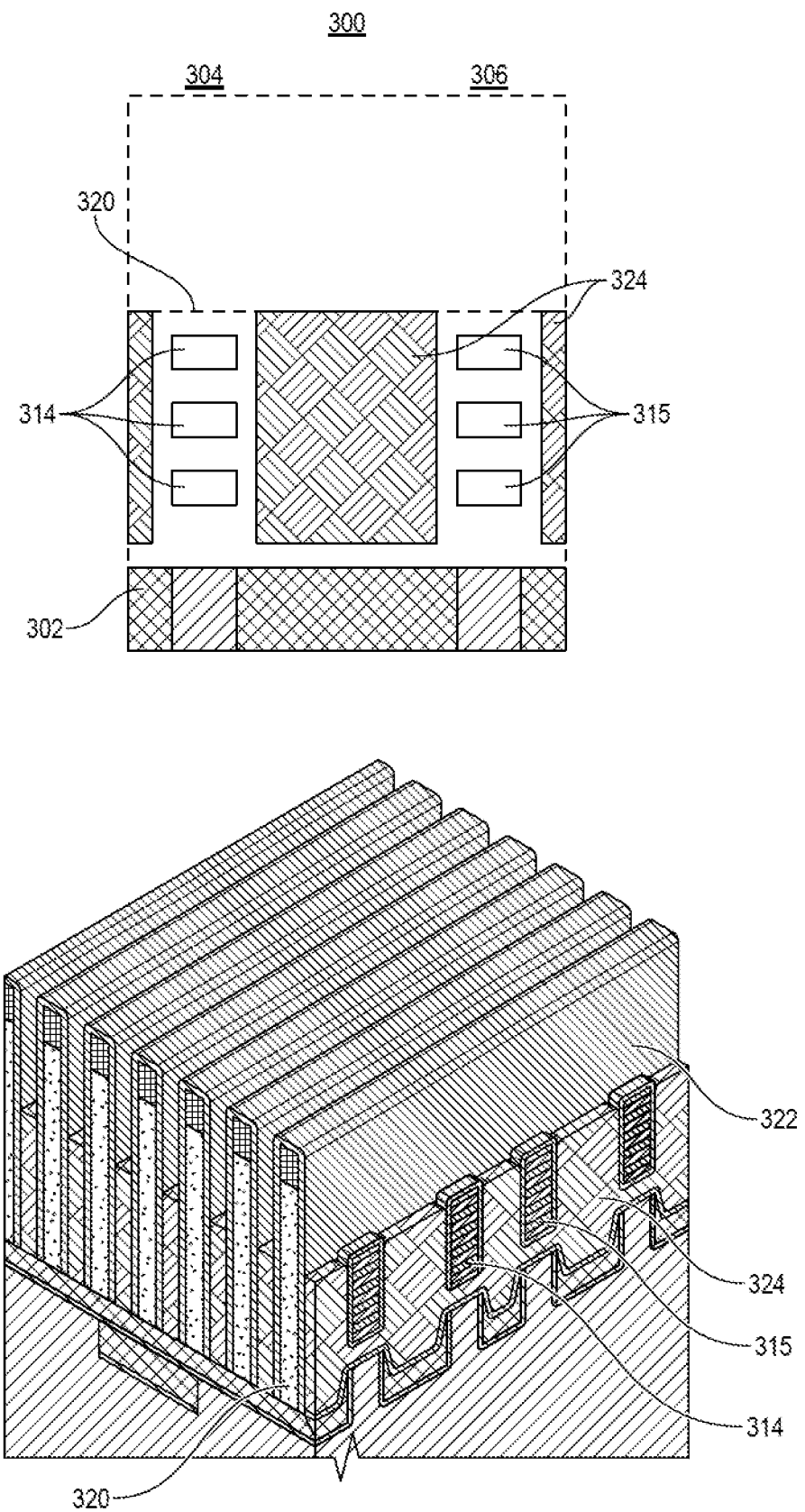

Referring to FIG. 3B, according to the disclosed embodiments, a mold structure 324 is formed on either side of the first and second gate stacks 320 against the gate spacer 322, as shown. In embodiments, the mold structure 324 may comprise a material such as TiN. The mold structure 324 may be polished down to the level of the gate stack 320 and then recessed to a top of the fin, as shown.

Figure 3C:
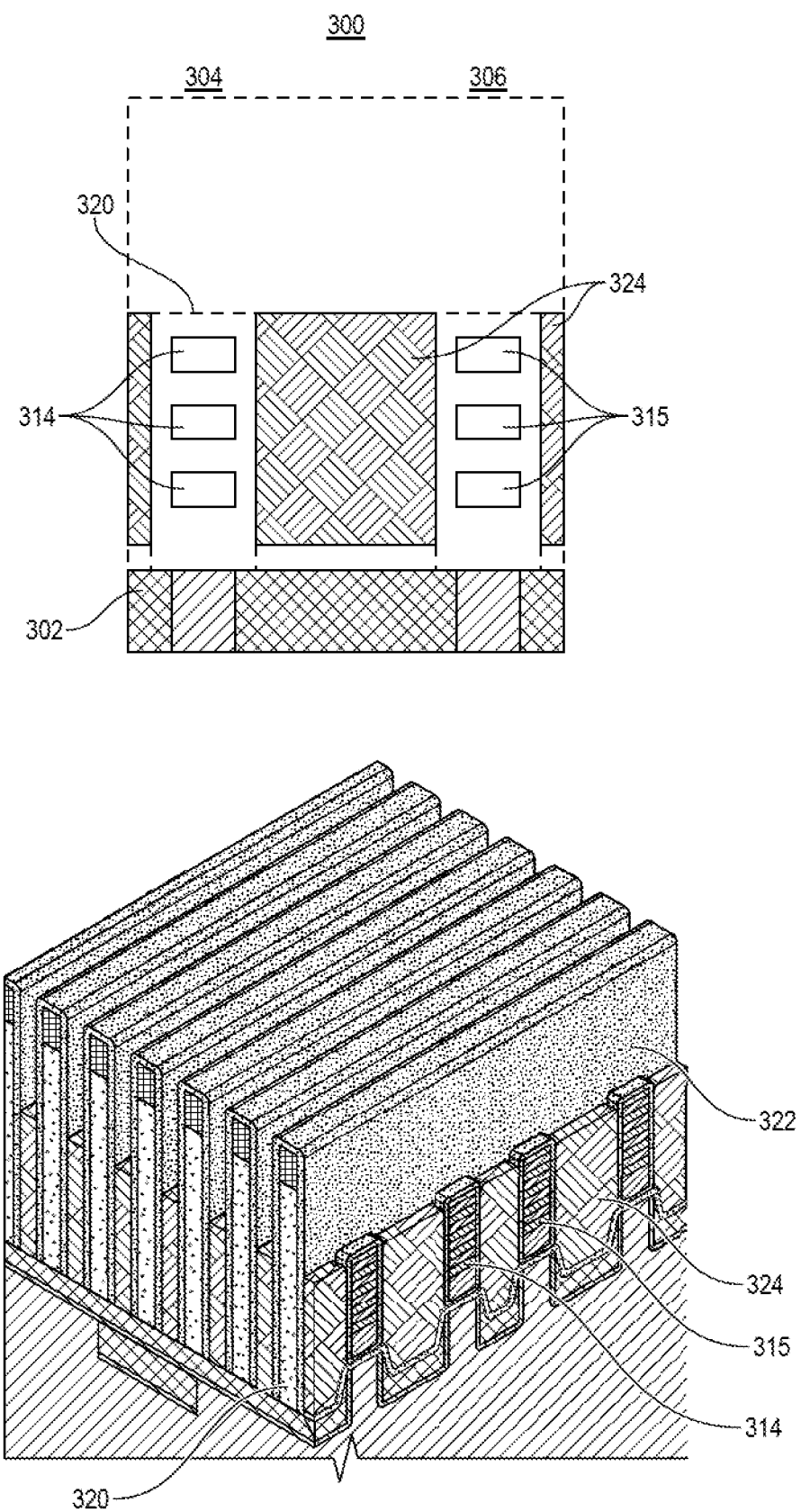

Referring to FIG. 3C, a spacer etch is performed that cuts the fin and removes the gate spacer 322 from around the first plurality of nanowires 314 and the second plurality of nanowires 315.

Figure 3D:
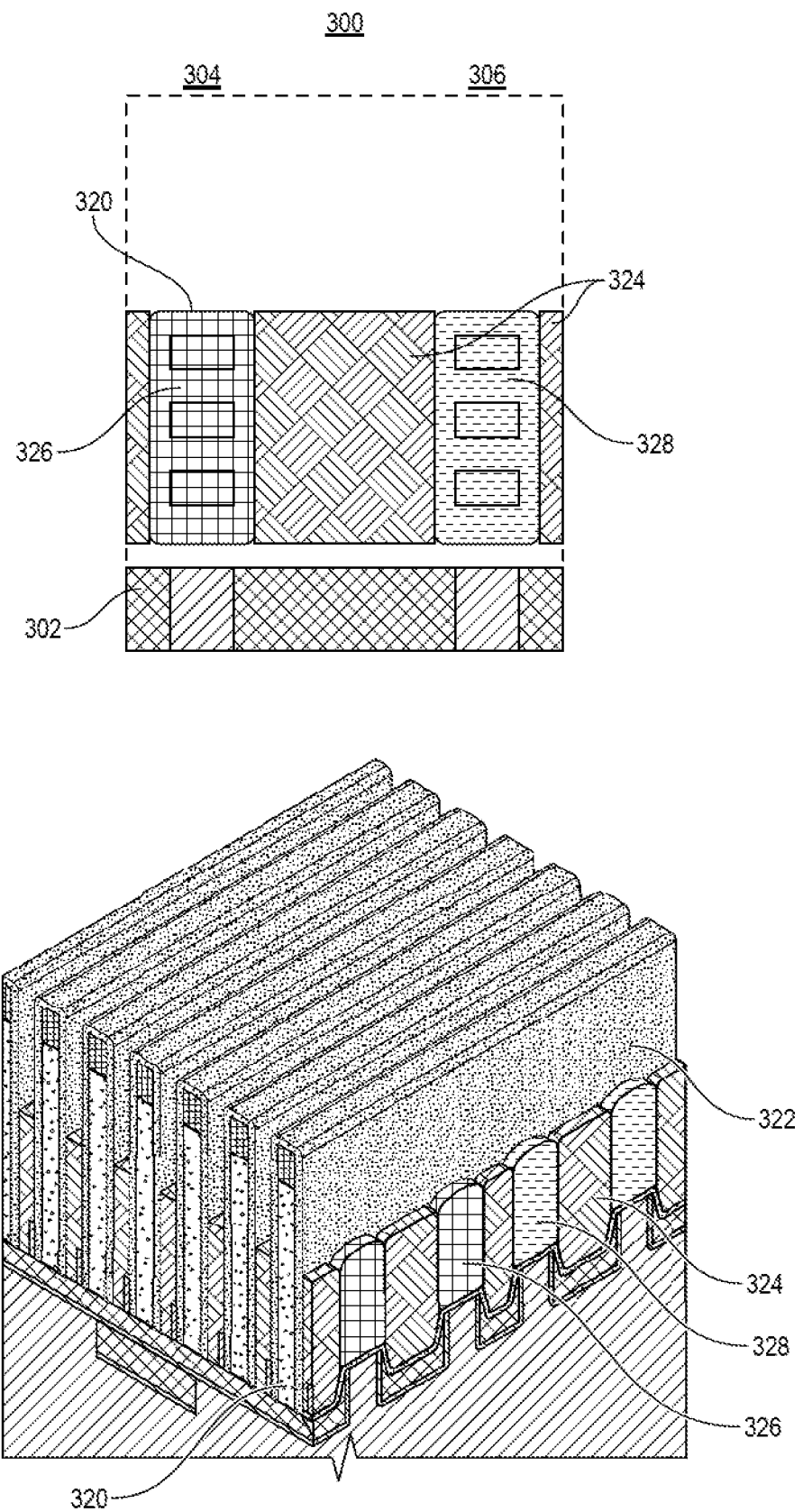

Referring to FIG. 3D, epitaxial source or drain structures 326 are grown at opposite first and second ends of the first plurality of nanowires 314 (FIG. 3C) within confinement of the mold structure 324 in PMOS region 304. Similarly, epitaxial source or drain structures 328 are grown at opposite first and second ends of the second plurality of nanowires 315 (FIG. 3C) within confinement of the mold structure 324 in NMOS region 306. Epitaxial source or drain structures 326 may comprise P-epi, and epitaxial source or drain structures 328 may comprise N-epi.

Figure 3E:
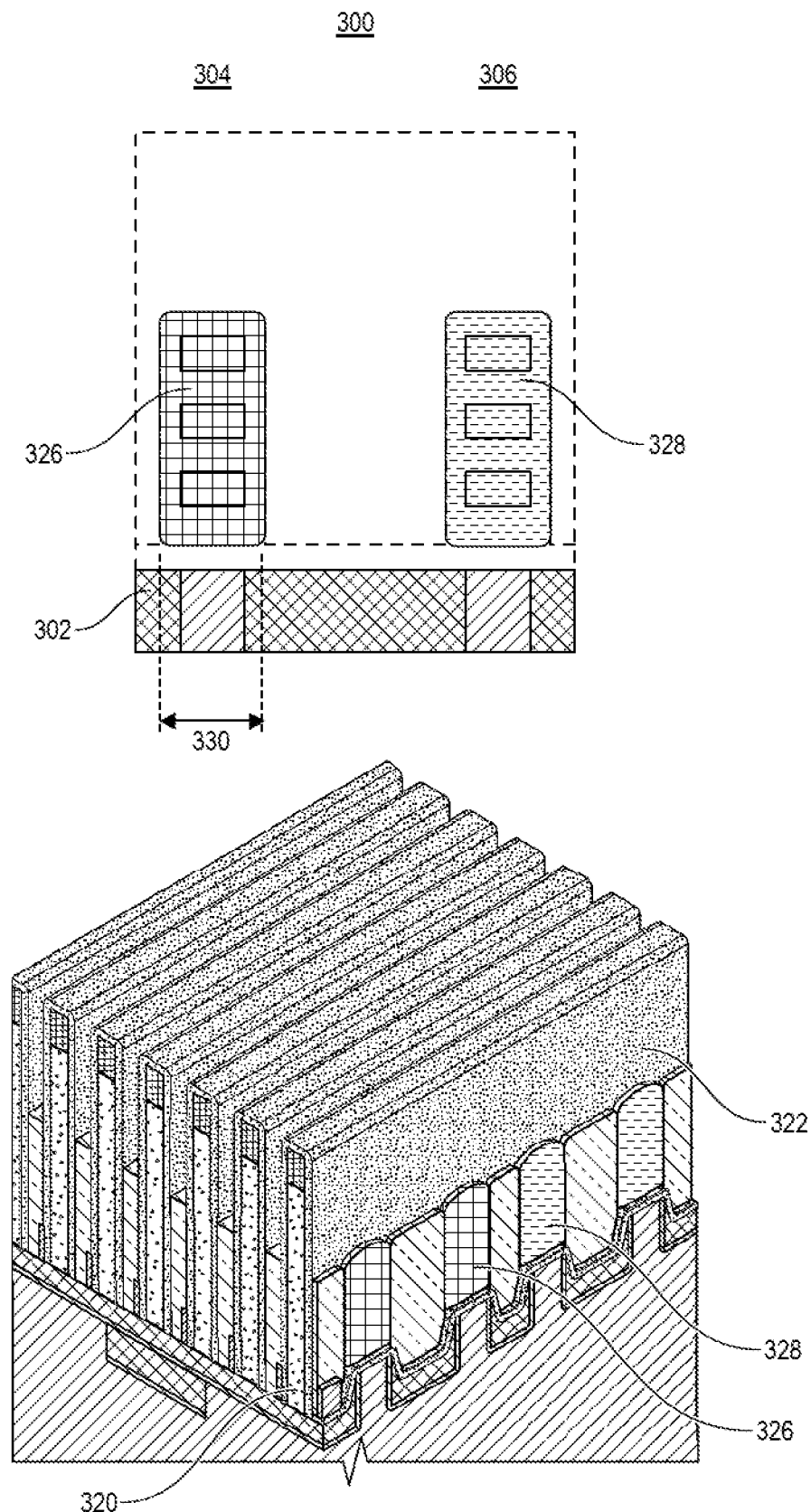

Referring to FIG. 3E, after growth of the epitaxial source or drain structures, the mold structure 324 is removed. It should be understood that in the top view in FIGS. 3D and 3E, the epitaxial source or drain structures 326 and 328 grow in a direction in out of the page. In one such embodiment, the epitaxial source or drain structures 326 and 328 are non-discrete epitaxial source or drain structures. In another such embodiment, the epitaxial source or drain structures 326 and 328 are discrete epitaxial source or drain structures, structural examples of which are described below.

According to embodiments, the addition of the mold structure 324 to the process flow limits the lateral wingspan 330 of the epitaxial source or drain structures 326 and 328. The wingspan 330 of the epitaxial source or drain structures 326 and 328 is defined by the distance from an edge of the nanowires to an edge of the epitaxial source or drain structures, and this distance in turn, is predefined by the thickness of the gate spacer 322. By modifying the thickness of the gate spacer 322, a range of wingspans 330 can be created for the epitaxial source or drain structures 326 and 328. As one example, the wingspan 330 may range in distance from 3 to 12 nm.

In the embodiment shown in FIG. 3E (bottom view), the gate cut view on isolation (between fins) may show a relatively thicker gate spacers 322 at the bottom of the gate structure 320 (aligned to the fin) compared to the gate spacers 322 above the fin-level. Since the mold structure 324 (from FIG. 3D) covers the gate spacers 322 from top of fin-level to bottom of the gate, the gate spacer 322 at this level may have less erosion during spacer-etch and epi process section, as compared to the gate spacers 322 above fin-level. This is applicable to all embodiments including gate-all-around and finFet structures.

Figures 1, 3F:
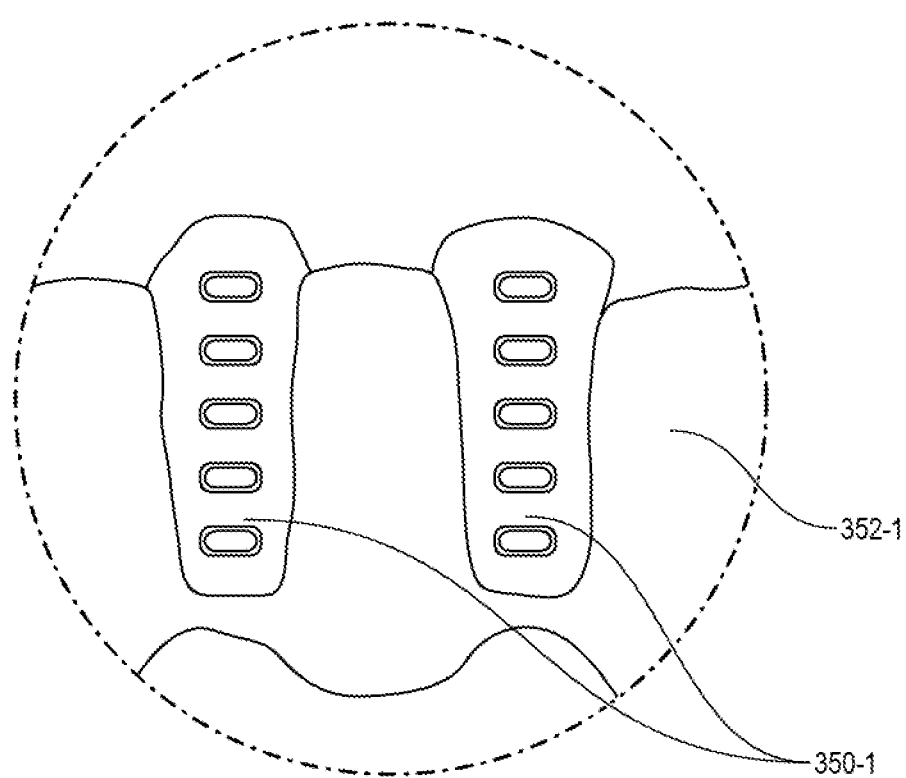
Figures 2, 3F:
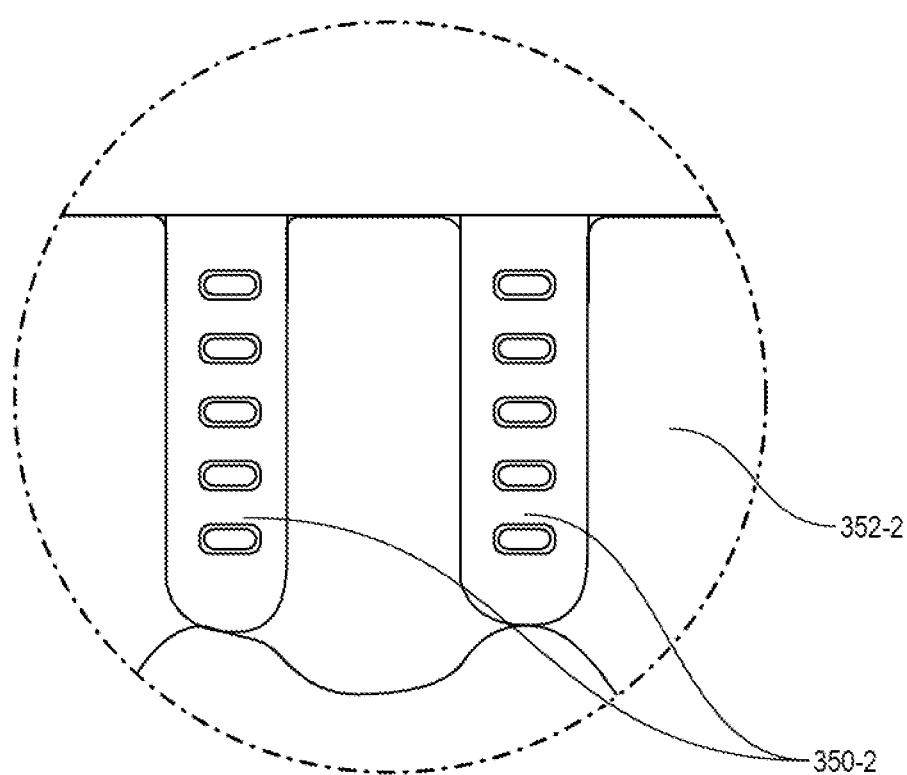
Figures 3, 3F:
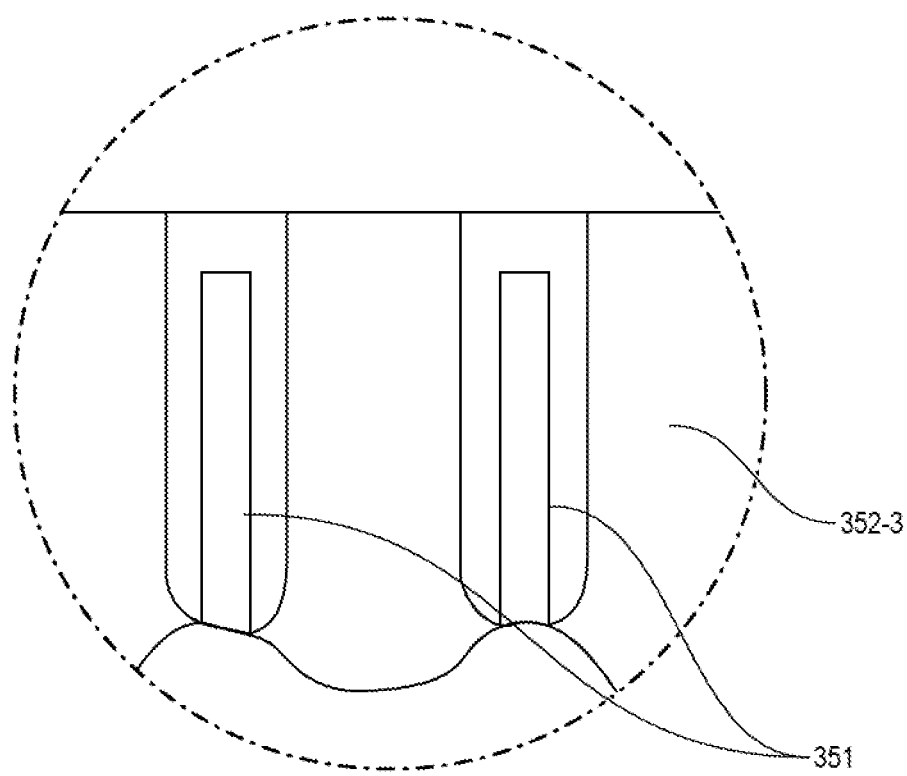

FIGS. 3F-1, 3F-2 and 3F-3 illustrate a TEM cross-sectional view of an integrated circuit structure having confined epitaxial source or drain structures 350 due to the presence of the mold structure during fabrication. FIG. 3F-1 illustrates an embodiment of a GAA structure with a bottom dielectric. FIG. 3F-2 illustrates an embodiment of a GAA structure without a bottom dielectric. And FIG. 3F-3 illustrates an embodiment of a finFet structure.

In FIGS. 3F-1 and 3F-2, the epitaxial source or drain structures 350-1 and 350-2 have substantially vertical (e.g., +/−5 degrees) opposing sidewalls that faced confining sidewalls of the mold structure 324. The lateral wingspan of the epitaxial source or drain structures 350-1 and 350-2 is substantially symmetric around the nanoribbons, where the distance from a left edge of nanowires to a left edge of the epitaxial source or drain structures 350 is substantially the same as distance from a right edge of the nanowires to a right edge of the epitaxial source or drain structures 350. Additionally, there could be dislocations in epitaxial source or drain structures 350-1 and 350-2 along the opposing sidewalls that faced sidewalls of the mold structure 324.

If the mold was damaged during processing, as shown in FIG. 3F-1, the epitaxial source or drain structures 350-1 may also have a top that has a generally mushroom shape over a top of a dielectric material 352-1 caused by epi growth above a height of the mold structure 324. Otherwise, as shown in FIG. 3F-2, the epitaxial source or drain structures 350-2 may be generally planar with dielectric material 352-2.

FIG. 3F-3 is similar in that the epitaxial source or drain structures 351 have substantially vertical (e.g., +/−5 degrees) opposing sidewalls that faced confining sidewalls of the mold structure 324. The lateral wingspan of the epitaxial source or drain structures 351 is substantially symmetric around the fins, where the distance from a left edge of a fin to a left edge of the epitaxial source or drain structures 351 is substantially the same as distance from a right edge of the fin to a right edge of the epitaxial source or drain structures 351. There could be dislocations in epitaxial source or drain structures 351. In case of a damaged mold, the epitaxial source or drain structures 351 may also exhibit a mushroom shape, as described above.

In addition, the distance from the edge of fin or nanoribbon to the edge of the epitaxial source or drain structures will be substantially equal for both NMOS and PMOS source or drains and for any width of Fin or nanoribbon.

One or more embodiments described herein are directed dual epitaxial (EPI) connections for nanowire or nanoribbon transistors using partial source or drain (SD) and asymmetric trench contact (TCN) depth. In an embodiment, an integrated circuit structure is fabricated by forming source-drain openings of nanowire/nanoribbon transistors which are partially filled with SD epitaxy. A remainder of the opening is filled with a conductive material. Deep trench formation on one of the source or drain side enables direct contact to a backside interconnect level.

In an exemplary process flow, FIGS. 4A-4J illustrates cross-sectional views of various operations in a method of fabricating a gate-all-around integrated circuit structure, in accordance with an embodiment of the present disclosure.

Figure 4B:
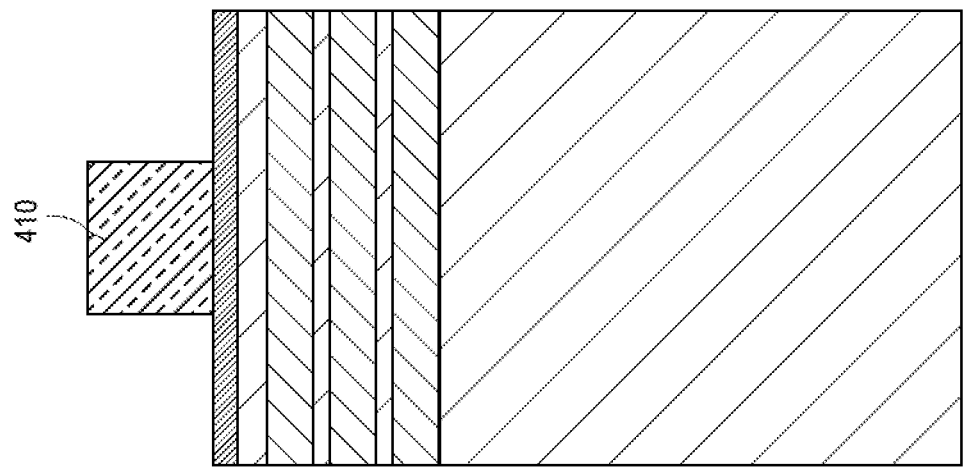
FIGS. 4A-4J illustrates cross-sectional views of various operations in a method of fabricating a gate-all-around integrated circuit structure, in accordance with an embodiment of the present disclosure.
Figure 4A:
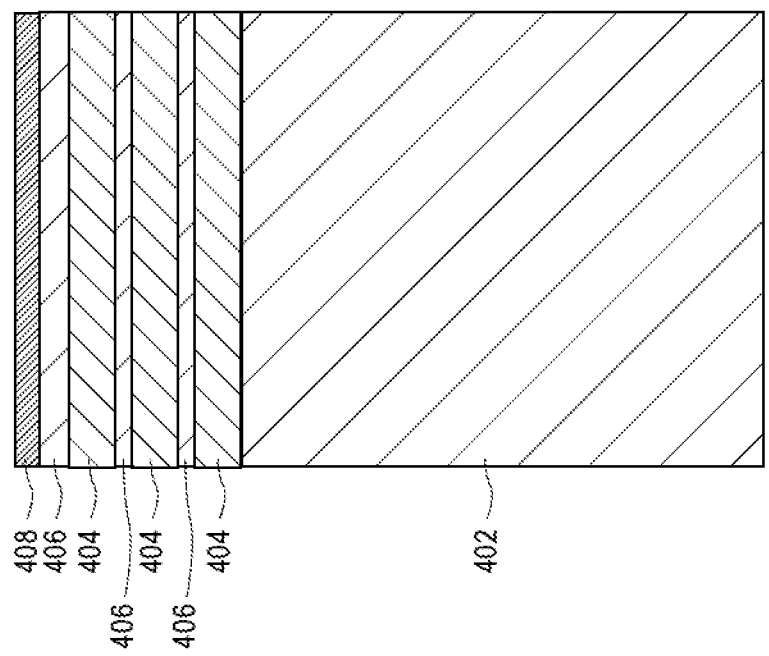

Referring to FIG. 4A, a method of fabricating an integrated circuit structure includes forming a starting stack 400, which includes alternating silicon germanium layer 404 and silicon layers 406 above a fin 402, such as a silicon fin. The silicon layers 406 may be referred to as a vertical arrangement of silicon nanowires. A protective cap 408 may be formed above the alternating silicon germanium layer 404 and silicon layers 406, as is depicted.

Referring to FIG. 4B, a gate stack 410 is formed over the vertical arrangement of nanowires 406. Portions of the vertical arrangement of nanowires 406 are then released by removing portions of the silicon germanium layer 404 to provide recessed silicon germanium layers 404' and cavities 412, as is depicted in FIG. 4C.

It is to be appreciated that the structure of FIG. 4C may be fabricated to completion without first performing the deep etch and asymmetric contact processing described below in association with FIG. 4D. In either case (e.g., with or without asymmetric contact processing), in an embodiment, a fabrication process involves use of a process scheme that provides a gate-all-around integrated circuit structure having a depopulated channel structure, an example of which is described above in association with FIGS. 1, 2 and 3A-3B.

Figure 4D:
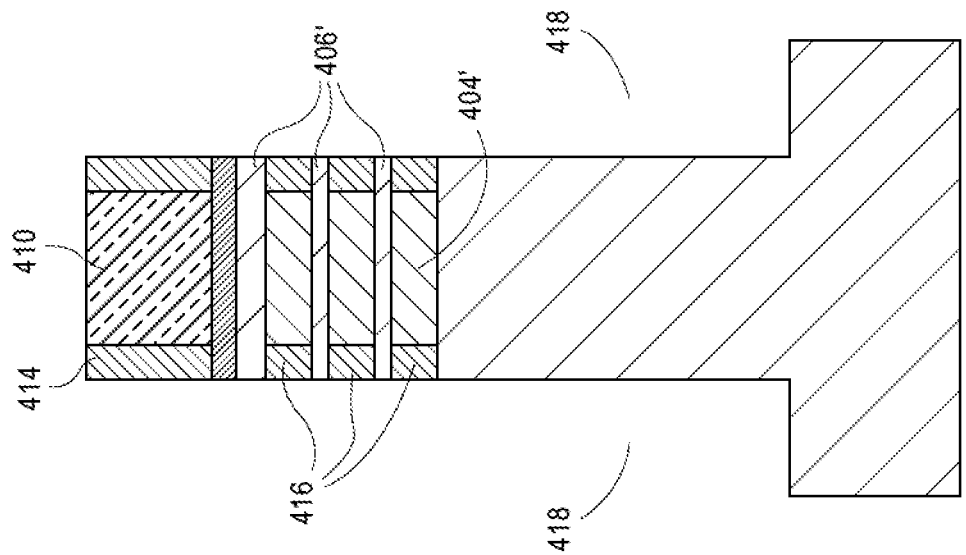
Figure 4C:
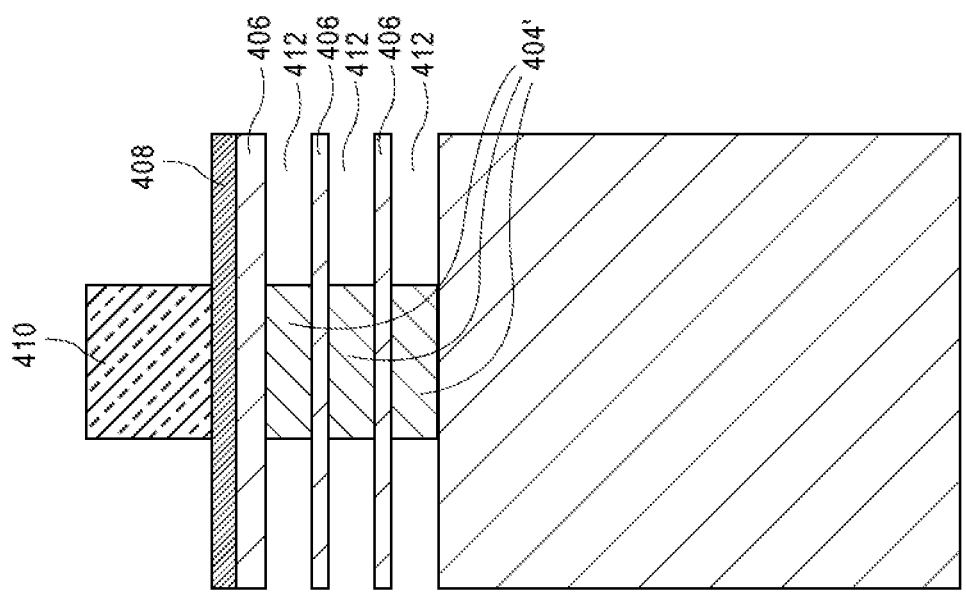

Referring to FIG. 4D, upper gate spacers 414 are formed at sidewalls of the gate structure 410. Cavity spacers 416 are formed in the cavities 412 beneath the upper gate spacers 414. A deep trench contact etch is then performed to form trenches 418 and to formed recessed nanowires 406'.

Figure 4G:
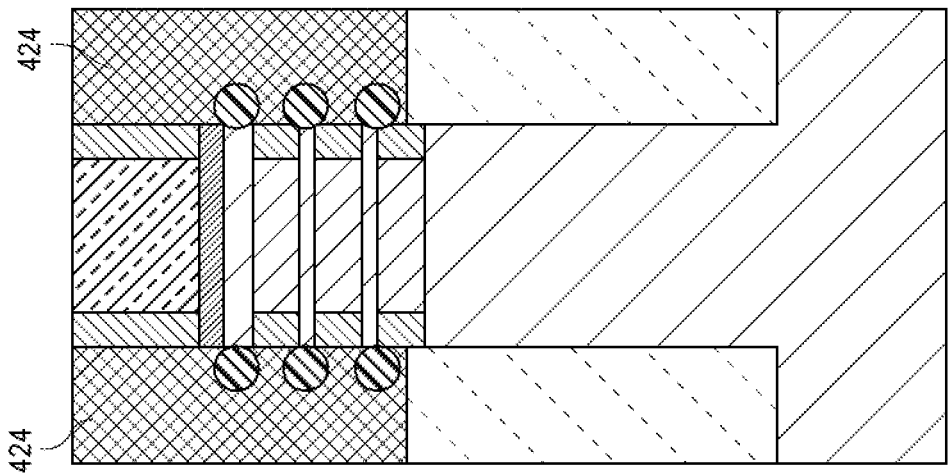
Figure 4F:
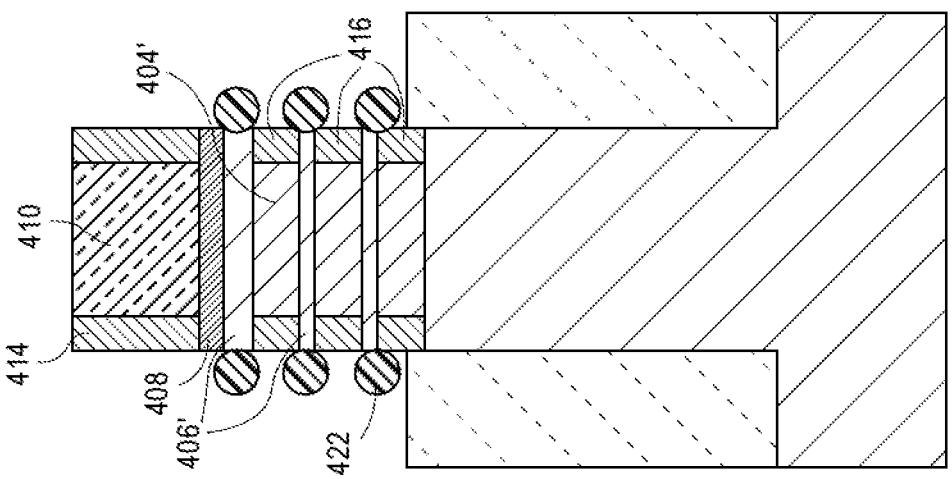
Figure 4E:
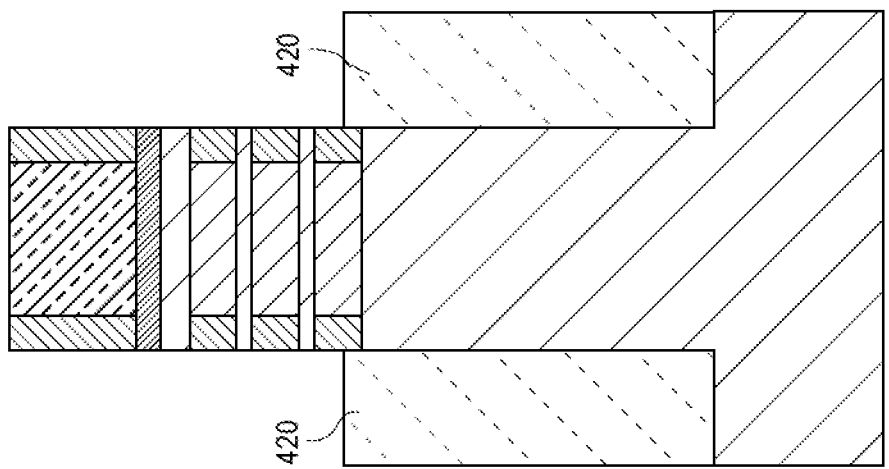

A sacrificial material 420 is then formed in the trenches 418, as is depicted in FIG. 4E. Although not shown, a mold structure 324 may be formed at this point in the process to confine epitaxial growth according to the disclosed embodiments. In embodiments, the gate cut view on isolation (between fins) may show a relatively thicker upper gate spacers 414 at the bottom of the gate structure 410 (aligned to the fin) compared to the upper gate spacers 414 above the fin-level. Since the mold structure 324 covers the upper gate spacers 414 from top of fin-level to the bottom of the gate, the gate-spacers 414 may have less erosion at this level during spacer-etch and epi process section, as compared to the upper gate spacers 414 above fin-level.

Referring to FIG. 4F, a first epitaxial source or drain structure (e.g., left-hand features 422) is formed at a first end of the vertical arrangement of nanowires 406'. A second epitaxial source or drain structure (e.g., right-hand features 422) is formed at a second end of the vertical arrangement of nanowires 406'. An inter-layer dielectric (ILD) material 424 is then formed at the sides of the gate electrode 410 and adjacent to the source or drain structures 422, as is depicted in FIG. 4G.

Figure 4J:
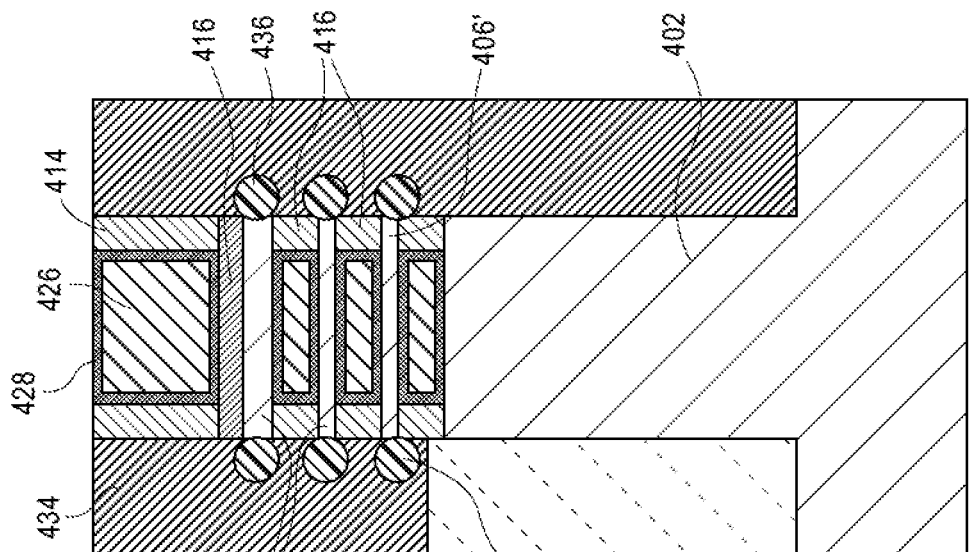
Figure 4I:
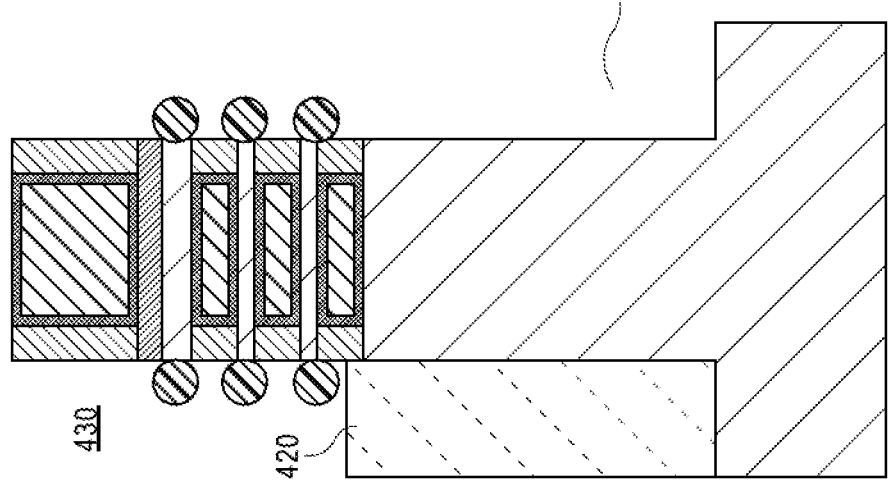
Figure 4H:
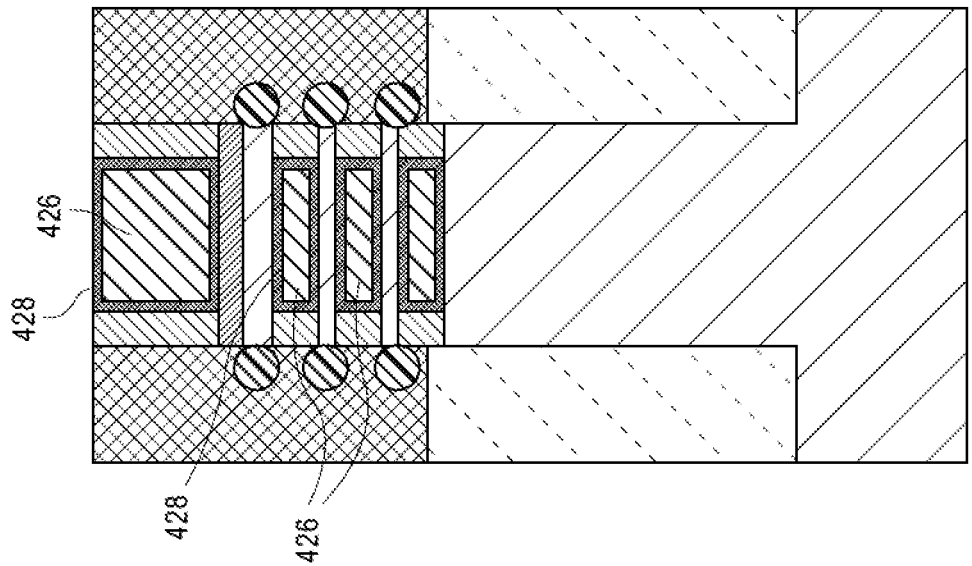

Referring to FIG. 4H, a replacement gate process is used to form a permanent gate dielectric 428 and a permanent gate electrode 426. In an embodiment, subsequent to removal of gate structure 410 and form a permanent gate dielectric 428 and a permanent gate electrode 426, the recessed silicon germanium layers 404' are removed to leave upper active nanowires or nanoribbons 406'. In an embodiment, the recessed silicon germanium layers 404' are removed selectively with a wet etch that selectively removes the silicon germanium while not etching the silicon layers. Etch chemistries such as carboxylic acid/nitric acid/HF chemistry, and citric acid/nitric acid/HF, for example, may be utilized to selectively etch the silicon germanium. Halide-based dry etches or plasma-enhanced vapor etches may also be used to achieve the embodiments herein.

Referring again to FIG. 4H, one or more of the bottom-most nanowires or nanoribbons 406' may ultimately be targeted for removal at location 499, e.g., by an approach described in association with FIGS. 1, 2 and 3A-3B. The permanent gate dielectric 428 and a permanent gate electrode 426 are formed to surround the nanowires or nanoribbons 406' and the targeted nanowire or nanoribbons 499.

Referring to FIG. 4I, the ILD material 424 is then removed. The sacrificial material 420 is then removed from one of the source drain locations (e.g., right-hand side) to form trench 432, but is not removed from the other of the source drain locations to form trench 430.

Referring to FIG. 4J, a first conductive contact structure 434 is formed coupled to the first epitaxial source or drain structure (e.g., left-hand features 422). A second conductive contact structure 436 is formed coupled to the second epitaxial source or drain structure (e.g., right-hand features 422). The second conductive contact structure 436 is formed deeper along the fin 402 than the first conductive contact structure 434. In an embodiment, although not depicted in FIG. 4J, the method further includes forming an exposed surface of the second conductive contact structure 436 at a bottom of the fin 402.

In an embodiment, the second conductive contact structure 436 is deeper along the fin 402 than the first conductive contact structure 434, as is depicted. In one such embodiment, the first conductive contact structure 434 is not along the fin 402, as is depicted. In another such embodiment, not depicted, the first conductive contact structure 434 is partially along the fin 402.

In an embodiment, the second conductive contact structure 436 is along an entirety of the fin 402. In an embodiment, although not depicted, in the case that the bottom of the fin 402 is exposed by a backside substrate removal process, the second conductive contact structure 436 has an exposed surface at a bottom of the fin 402.

It is to be appreciated that the structures resulting from the above exemplary processing schemes may be used in a same or similar form for subsequent processing operations to complete device fabrication, such as PMOS and/or NMOS device fabrication.

In an embodiment, the fins (and, possibly nanowires) are composed of a crystalline silicon germanium layer which may be doped with a charge carrier, such as but not limited to phosphorus, arsenic, boron, gallium or a combination thereof.

In an embodiment, trench isolation region, and trench isolation regions (trench isolations structures or trench isolation layers) described throughout, may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, trench isolation region is composed of a dielectric material such as, but not limited to, silicon dioxide, silicon oxy-nitride, silicon nitride, or carbon-doped silicon nitride.

Gate line may be composed of a gate electrode stack which includes a gate dielectric layer and a gate electrode layer. In an embodiment, the gate electrode of the gate electrode stack is composed of a metal gate and the gate dielectric layer is composed of a high-k material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate fin. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, the gate electrode layer is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode layer is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer 550 may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode layer may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact and overlying gate contact via may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material).

It is to be appreciated that not all aspects of the processes described above need be practiced to fall within the spirit and scope of embodiments of the present disclosure. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a tri-gate device, an independently accessed double gate device, or a FIN-FET. One or more embodiments may be particularly useful for fabricating semiconductor devices at a sub-10 nanometer (10 nm) technology node.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, hardmask materials, capping layers, or plugs are composed of dielectric materials different from the interlayer dielectric material. In one embodiment, different hardmask, capping or plug materials may be used in different regions so as to provide different growth or etch selectivity to each other and to the underlying dielectric and metal layers. In some embodiments, a hardmask layer, capping or plug layer includes a layer of a nitride of silicon (e.g., silicon nitride) or a layer of an oxide of silicon, or both, or a combination thereof. Other suitable materials may include carbon-based materials. Other hardmask, capping or plug layers known in the arts may be used depending upon the particular implementation. The hardmask, capping or plug layers maybe formed by CVD, PVD, or by other deposition methods.

In order to enable access to both conductive contact structures of source and drain contact structures, integrated circuit structures described herein may be fabricated using a back-side reveal of front-side structures fabrication approach. In some exemplary embodiments, reveal of the back-side of a transistor or other device structure entails wafer-level back-side processing. In contrast to a conventional TSV-type technology, a reveal of the back-side of a transistor as described herein may be performed at the density of the device cells, and even within sub-regions of a device. Furthermore, such a reveal of the back-side of a transistor may be performed to remove substantially all of a donor substrate upon which a device layer was disposed during front-side device processing. As such, a microns-deep TSV becomes unnecessary with the thickness of semiconductor in the device cells following a reveal of the back-side of a transistor potentially being only tens or hundreds of nanometers.

Reveal techniques described herein may enable a paradigm shift from "bottom-up" device fabrication to "center-out" fabrication, where the "center" is any layer that is employed in front-side fabrication, revealed from the back-side, and again employed in back-side fabrication. Processing of both a front-side and revealed back-side of a device structure may address many of the challenges associated with fabricating 3D ICs when primarily relying on front-side processing.

A reveal of the back-side of a transistor approach may be employed for example to remove at least a portion of a carrier layer and intervening layer of a donor-host substrate assembly. The process flow begins with an input of a donor-host substrate assembly. A thickness of a carrier layer in the donor-host substrate is polished (e.g., CMP) and/or etched with a wet or dry (e.g., plasma) etch process. Any grind, polish, and/or wet/dry etch process known to be suitable for the composition of the carrier layer may be employed. For example, where the carrier layer is a group IV semiconductor (e.g., silicon) a CMP slurry known to be suitable for thinning the semiconductor may be employed. Likewise, any wet etchant or plasma etch process known to be suitable for thinning the group IV semiconductor may also be employed.

In some embodiments, the above is preceded by cleaving the carrier layer along a fracture plane substantially parallel to the intervening layer. The cleaving or fracture process may be utilized to remove a substantial portion of the carrier layer as a bulk mass, reducing the polish or etch time needed to remove the carrier layer. For example, where a carrier layer is 400-900 μm in thickness, 100-700 μm may be cleaved off by practicing any blanket implant known to promote a wafer-level fracture. In some exemplary embodiments, a light element (e.g., H, He, or Li) is implanted to a uniform target depth within the carrier layer where the fracture plane is desired. Following such a cleaving process, the thickness of the carrier layer remaining in the donor-host substrate assembly may then be polished or etched to complete removal. Alternatively, where the carrier layer is not fractured, the grind, polish and/or etch operation may be employed to remove a greater thickness of the carrier layer.

Next, exposure of an intervening layer is detected. Detection is used to identify a point when the back-side surface of the donor substrate has advanced to nearly the device layer. Any endpoint detection technique known to be suitable for detecting a transition between the materials employed for the carrier layer and the intervening layer may be practiced. In some embodiments, one or more endpoint criteria are based on detecting a change in optical absorbance or emission of the back-side surface of the donor substrate during the polishing or etching performed. In some other embodiments, the endpoint criteria are associated with a change in optical absorbance or emission of byproducts during the polishing or etching of the donor substrate back-side surface. For example, absorbance or emission wavelengths associated with the carrier layer etch byproducts may change as a function of the different compositions of the carrier layer and intervening layer. In other embodiments, the endpoint criteria are associated with a change in mass of species in byproducts of polishing or etching the back-side surface of the donor substrate. For example, the byproducts of processing may be sampled through a quadrupole mass analyzer and a change in the species mass may be correlated to the different compositions of the carrier layer and intervening layer. In another exemplary embodiment, the endpoint criteria is associated with a change in friction between a back-side surface of the donor substrate and a polishing surface in contact with the back-side surface of the donor substrate.

Detection of the intervening layer may be enhanced where the removal process is selective to the carrier layer relative to the intervening layer as non-uniformity in the carrier removal process may be mitigated by an etch rate delta between the carrier layer and intervening layer. Detection may even be skipped if the grind, polish and/or etch operation removes the intervening layer at a rate sufficiently below the rate at which the carrier layer is removed. If an endpoint criteria is not employed, a grind, polish and/or etch operation of a predetermined fixed duration may stop on the intervening layer material if the thickness of the intervening layer is sufficient for the selectivity of the etch. In some examples, the carrier etch rate: intervening layer etch rate is 3:1-10:1, or more.

Upon exposing the intervening layer, at least a portion of the intervening layer may be removed. For example, one or more component layers of the intervening layer may be removed. A thickness of the intervening layer may be removed uniformly by a polish, for example. Alternatively, a thickness of the intervening layer may be removed with a masked or blanket etch process. The process may employ the same polish or etch process as that employed to thin the carrier, or may be a distinct process with distinct process parameters. For example, where the intervening layer provides an etch stop for the carrier removal process, the latter operation may employ a different polish or etch process that favors removal of the intervening layer over removal of the device layer. Where less than a few hundred nanometers of intervening layer thickness is to be removed, the removal process may be relatively slow, optimized for across-wafer uniformity, and more precisely controlled than that employed for removal of the carrier layer. A CMP process employed may, for example employ a slurry that offers very high selectively (e.g., 100:1-300:1, or more) between semiconductor (e.g., silicon) and dielectric material (e.g., SiO) surrounding the device layer and embedded within the intervening layer, for example, as electrical isolation between adjacent device regions.

For embodiments where the device layer is revealed through complete removal of the intervening layer, back-side processing may commence on an exposed back-side of the device layer or specific device regions there in. In some embodiments, the back-side device layer processing includes a further polish or wet/dry etch through a thickness of the device layer disposed between the intervening layer and a device region previously fabricated in the device layer, such as a source or drain region.

In some embodiments where the carrier layer, intervening layer, or device layer back-side is recessed with a wet and/or plasma etch, such an etch may be a patterned etch or a materially selective etch that imparts significant non-planarity or topography into the device layer back-side surface. As described further below, the patterning may be within a device cell (i.e., "intra-cell" patterning) or may be across device cells (i.e., "inter-cell" patterning). In some patterned etch embodiments, at least a partial thickness of the intervening layer is employed as a hard mask for back-side device layer patterning. Hence, a masked etch process may preface a correspondingly masked device layer etch.

The above described processing scheme may result in a donor-host substrate assembly that includes IC devices that have a back-side of an intervening layer, a back-side of the device layer, and/or back-side of one or more semiconductor regions within the device layer, and/or front-side metallization revealed. Additional back-side processing of any of these revealed regions may then be performed during downstream processing.

It is to be appreciated that, as used throughout the disclosure, a sub-fin, a nanowire, a nanoribbon, or a fin described herein may be a silicon sub-fin, a silicon nanowire, a silicon nanoribbon, or a silicon fin. As used throughout, a silicon layer or structure may be used to describe a silicon material composed of a very substantial amount of, if not all, silicon. However, it is to be appreciated that, practically, 100% pure Si may be difficult to form and, hence, could include a tiny percentage of carbon, germanium or tin. Such impurities may be included as an unavoidable impurity or component during deposition of Si or may "contaminate" the Si upon diffusion during post deposition processing. As such, embodiments described herein directed to a silicon layer or structure may include a silicon layer or structure that contains a relatively small amount, e.g., "impurity" level, non-Si atoms or species, such as Ge, C or Sn. It is to be appreciated that a silicon layer or structure as described herein may be undoped or may be doped with dopant atoms such as boron, phosphorous or arsenic.

It is to be appreciated that, as used throughout the disclosure, a sub-fin, a nanowire, a nanoribbon, or a fin described herein may be a silicon germanium sub-fin, a silicon germanium nanowire, a silicon germanium nanoribbon, or a silicon germanium fin. As used throughout, a silicon germanium layer or structure may be used to describe a silicon germanium material composed of substantial portions of both silicon and germanium, such as at least 5% of both. In some embodiments, the amount of germanium is greater than the amount of silicon. In particular embodiments, a silicon germanium layer or structure includes approximately 60% germanium and approximately 40% silicon ($Si_{40}Ge_{60}$). In other embodiments, the amount of silicon is greater than the amount of germanium. In particular embodiments, a silicon germanium layer or structure includes approximately 30% germanium and approximately 70% silicon ($Si_{70}Ge_{30}$). It is to be appreciated that, practically, 100% pure silicon germanium (referred to generally as SiGe) may be difficult to form and, hence, could include a tiny percentage of carbon or tin. Such impurities may be included as an unavoidable impurity or component during deposition of SiGe or may "contaminate" the SiGe upon diffusion during post deposition processing. As such, embodiments described herein directed to a silicon germanium layer or structure may include a silicon germanium layer or structure that contains a relatively small amount, e.g., "impurity" level, non-Ge and non-Si atoms or species, such as carbon or tin. It is to be appreciated that a silicon germanium layer or structure as described herein may be undoped or may be doped with dopant atoms such as boron, phosphorous or arsenic.

It is to be appreciated that embodiments described herein may be implemented to fabricate nanowire and/or nanoribbon structures having a different number of active wire/ribbon channels. Embodiments described herein may be implemented to enable the fabrication of nanowire/nanoribbon-based CMOS architectures.

In an embodiment, in order to engineer different devices having different drive-current strengths, a selective depopulation flow can be patterned with lithography so that ribbons and wires (RAW) are de-populated only from specific devices. In another embodiment, the entire wafer may be de-populated uniformly so all devices have same number of RAW.

Figure 5:
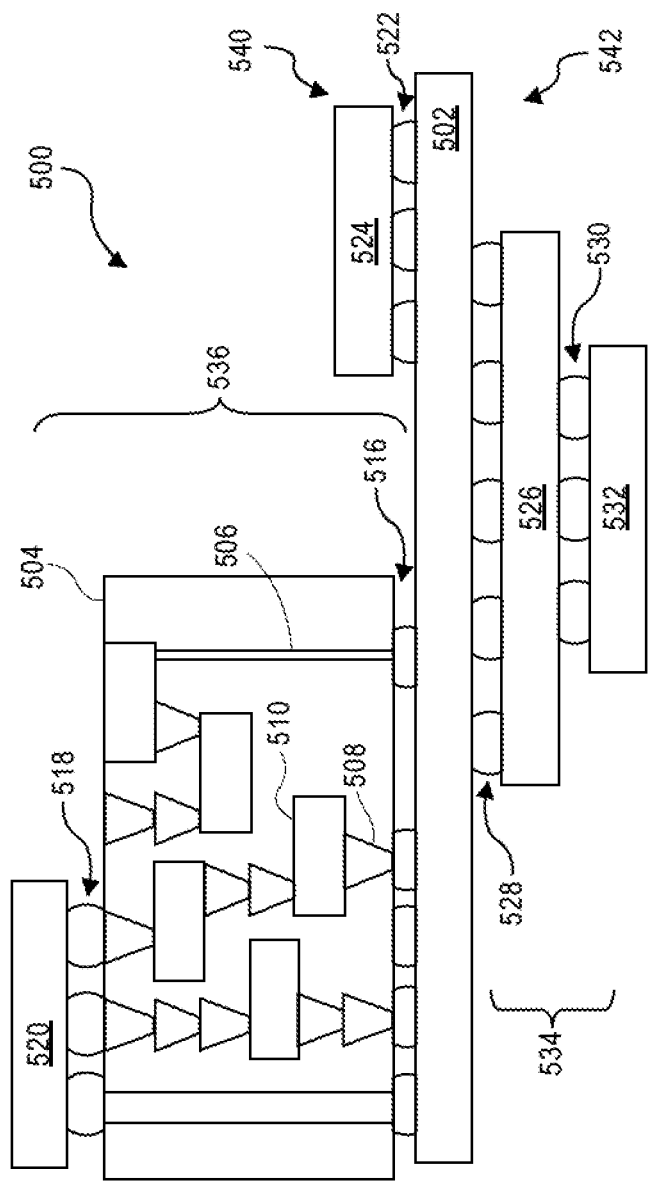
FIG. 5 illustrates an IC device assembly including components having one or more integrated circuit structures described herein.

Referring to FIG. 5, an IC device assembly 500 includes components having one or more integrated circuit structures described herein. The IC device assembly 500 includes a number of components disposed on a circuit board 502 (which may be, e.g., a motherboard). The IC device assembly 500 includes components disposed on a first face 540 of the circuit board 502 and an opposing second face 542 of the circuit board 502. Generally, components may be disposed on one or both faces 540 and 542. In particular, any suitable ones of the components of the IC device assembly 500 may include a number of transistor architectures utilizing IC structures having confined epitaxial source or drain structures, such as disclosed herein.

In some embodiments, the circuit board 502 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 502. In other embodiments, the circuit board 502 may be a non-PCB substrate.

The IC device assembly 500 illustrated in FIG. 5 includes a package-on-interposer structure 536 coupled to the first face 540 of the circuit board 502 by coupling components 516. The coupling components 516 may electrically and mechanically couple the package-on-interposer structure 536 to the circuit board 502, and may include solder balls, male and female portions of a socket, an adhesive, an underfill material, and/or any other suitable electrical and/or mechanical coupling structure.

The package-on-interposer structure 536 may include an IC package 520 coupled to an interposer 504 by coupling components 518. The coupling components 518 may take any suitable form for the application, such as the forms discussed above with reference to the coupling components 516. Although a single IC package 520 is shown, multiple IC packages may be coupled to the interposer 504. It is to be appreciated that additional interposers may be coupled to the interposer 504. The interposer 504 may provide an intervening substrate used to bridge the circuit board 502 and the IC package 520. The IC package 520 may be or include, for example, a die, or any other suitable component. Generally, the interposer 504 may spread a connection to a wider pitch or reroute a connection to a different connection. For example, the interposer 504 may couple the IC package 520 (e.g., a die) to a ball grid array (BGA) of the coupling components 516 for coupling to the circuit board 502. In the embodiment illustrated in FIG. 5, the IC package 520 and the circuit board 502 are attached to opposing sides of the interposer 504. In other embodiments, the IC package 520 and the circuit board 502 may be attached to a same side of the interposer 504. In some embodiments, three or more components may be interconnected by way of the interposer 504.

The interposer 504 may be formed of an epoxy resin, a fiberglass-reinforced epoxy resin, a ceramic material, or a polymer material such as polyimide. In some implementations, the interposer 504 may be formed of alternate rigid or flexible materials that may include the same materials described above for use in a semiconductor substrate, such as silicon, germanium, and other group III-V and group IV materials. The interposer 504 may include metal interconnects 510 and vias 508, including but not limited to through-silicon vias (TSVs) 506. The interposer 504 may further include embedded devices, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 504. The package-on-interposer structure 536 may take the form of any of the package-on-interposer structures known in the art.

The IC device assembly 500 may include an IC package 524 coupled to the first face 540 of the circuit board 502 by coupling components 522. The coupling components 522 may take the form of any of the embodiments discussed above with reference to the coupling components 516, and the IC package 524 may take the form of any of the embodiments discussed above with reference to the IC package 520.

The IC device assembly 500 illustrated in FIG. 5 includes a package-on-package structure 534 coupled to the second face 542 of the circuit board 502 by coupling components 528. The package-on-package structure 534 may include an IC package 526 and an IC package 532 coupled together by coupling components 530 such that the IC package 526 is disposed between the circuit board 502 and the IC package 532. The coupling components 528 and 530 may take the form of any of the embodiments of the coupling components 516 discussed above, and the IC packages 526 and 532 may take the form of any of the embodiments of the IC package 520 discussed above. The package-on-package structure 534 may be configured in accordance with any of the package-on-package structures known in the art.

Figure 6:
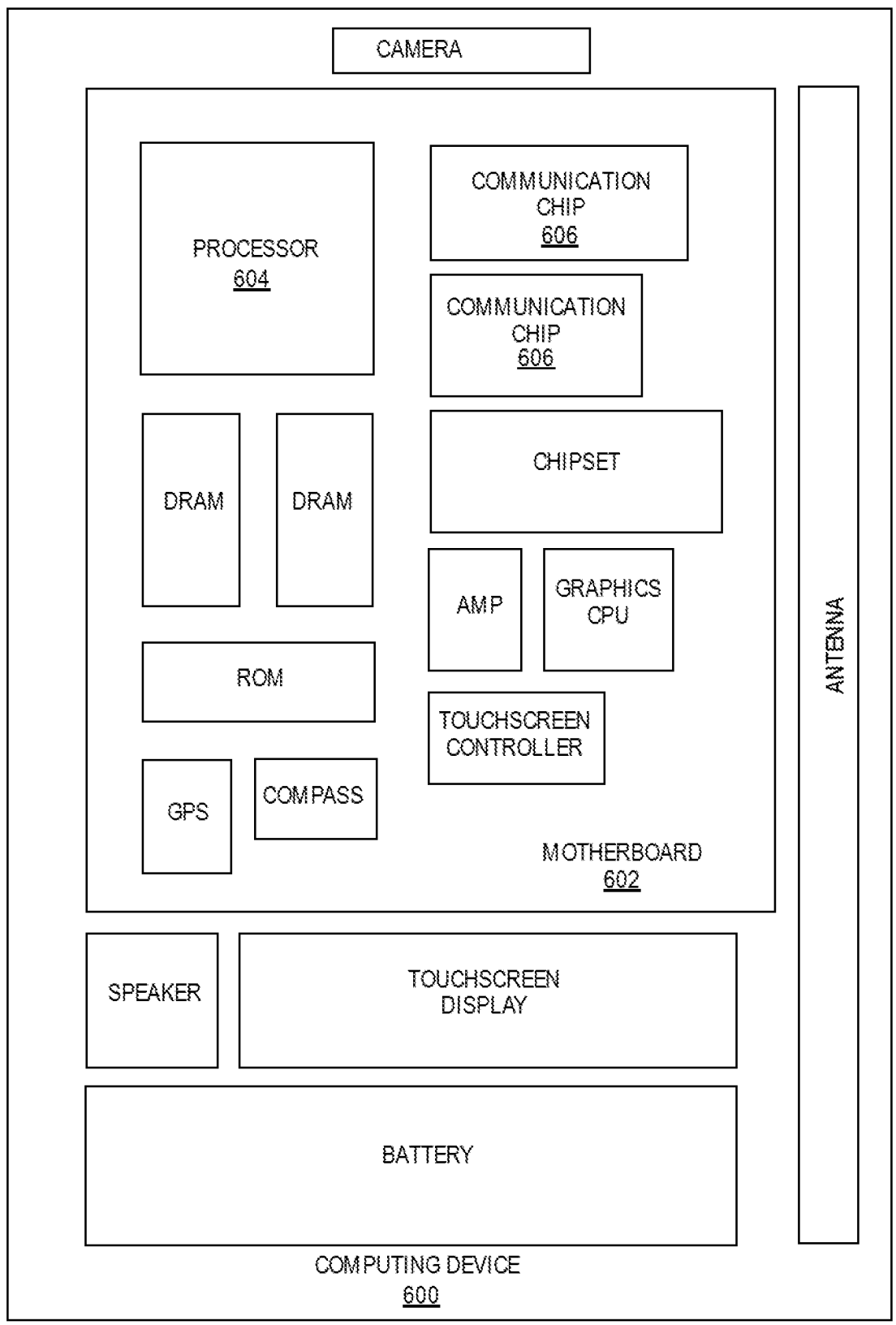
FIG. 6 illustrates a computing device in accordance with one implementation of the disclosure.

FIG. 6 illustrates a computing device 600 in accordance with one implementation of the disclosure. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the disclosure, the integrated circuit die of the processor includes one or more transistor architectures utilizing IC structures having confined epitaxial source or drain structures, in accordance with implementations of embodiments of the disclosure. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of embodiments of the disclosure, the integrated circuit die of the communication chip includes one or more transistor architectures utilizing IC structures having confined epitaxial source or drain structures, in accordance with implementations of embodiments of the disclosure.

In further implementations, another component housed within the computing device 600 may contain an integrated circuit die that includes one or more transistor architectures utilizing IC structures having confined epitaxial source or drain structures, in accordance with implementations of embodiments of the disclosure.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Thus, embodiments described herein include transistor architectures utilizing IC structures having confined epitaxial source or drain structures.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes a plurality of nanowires above a sub-fin. A gate stack is over the plurality of nanowires and the sub-fin. Epitaxial source or drain structures are on opposite ends of the plurality of nanowires, the epitaxial source or drain structures having substantially vertical opposing sidewalls and a substantially lateral wingspan that is symmetric around the plurality of nanowires where a first distance from a left edge of plurality of nanowires to a left edge of the epitaxial source or drain structures is substantially equal as a second distance from right edge of plurality of nanowires to a right edge of epitaxial source or drain structures.

Example embodiment 2: The integrated circuit structure of embodiment 1, wherein the epitaxial source or drain structures further include dislocations along the opposing sidewalls.

Example embodiment 3: The integrated circuit structure of embodiment 1, 2 or 3, wherein the epitaxial source or drain structures have a lateral wingspan of approximately 3-12 nm.

Example embodiment 4: The integrated circuit structure of embodiment 1, wherein the substantially vertical opposing sidewalls and the top surface having a generally mushroom shape of the epitaxial source or drain structures is due to confined growth inside a mold structure.

Example embodiment 5: The integrated circuit structure of embodiment 3, wherein the mold structure limits a lateral wingspan of the epitaxial source or drain structures.

Example embodiment 6: The integrated circuit structure of embodiment 4, wherein the lateral wingspan of the epitaxial source or drain structures is defined by a distance from an edge of the plurality of nanowires to an edge of the epitaxial source or drain structures.

Example embodiment 7: The integrated circuit structure of embodiment 4, wherein the wherein the lateral wingspan of the epitaxial source or drain structures is predefined by a thickness of a gate spacer.

Example embodiment 8: The integrated circuit structure of embodiment 1, 2, 3, 4, 5, 6, or 7 wherein the epitaxial source or drain structures are non-discrete epitaxial source or drain structures.

Example embodiment 9: The integrated circuit structure of embodiment 1, 2, 3, 4, 5, 6, or 7 or 8, wherein the epitaxial source or drain structures are discrete epitaxial source or drain structures.

Example embodiment 10: A computing device, comprising a board, and a component coupled to the board. The component includes an integrated circuit structure comprising a plurality of nanowires above a sub-fin. A gate stack is over the plurality of nanowires and the sub-fin. Epitaxial source or drain structures are on opposite ends of the plurality of nanowires, the epitaxial source or drain structures having substantially vertical opposing sidewalls and a substantially lateral wingspan that is symmetric around the plurality of nanowires where a first distance from a left edge of plurality of nanowires to a left edge of the epitaxial source or drain structures is substantially equal as a second distance from right edge of plurality of nanowires to a right edge of epitaxial source or drain structures.

Example embodiment 11: The computing device of embodiment 10, further comprising: a memory coupled to the board.

Example embodiment 12: The computing device of embodiment 10 or 11, further comprising: a communication chip coupled to the board.

Example embodiment 13: The computing device of embodiment 10 11 or 12, further comprising: a battery coupled to the board.

Example embodiment 14: The computing device of embodiment 10, 11 12 or 13, wherein the component is a packaged integrated circuit die.

Example embodiment 15: An integrated circuit structure comprises a plurality of fins having a sub-fin portion in a substrate and an active fin portion protruding from the substrate, and an isolation structure between and adjacent to sub-fin portions of the plurality of fins. The epitaxial source or drain structures are on opposite ends of the plurality of fins, the epitaxial source or drain structures having substantially vertical opposing sidewalls and a substantially lateral wingspan that is symmetric around the plurality of fins where a first distance from a left edge of plurality of fins to a left edge of the epitaxial source or drain structures is substantially equal as a second distance from right edge of plurality of fins to a right edge of epitaxial source or drain structures.

Example embodiment 16: The integrated circuit structure of embodiment 15, wherein the epitaxial source or drain structures further include dislocations along the opposing sidewalls.

Example embodiment 17: The integrated circuit structure of embodiment 15 or 16, wherein the epitaxial source or drain structures have a lateral wingspan of approximately 3-12 nm.

Example embodiment 18: The integrated circuit structure of embodiment 15, 16 or 17, wherein the substantially vertical opposing sidewalls and the top surface having a generally mushroom shape of the epitaxial source or drain structures is due to confined growth inside a mold structure.

Example embodiment 19: A computing device comprises a board and a component coupled to the board. The component includes an integrated circuit structure comprising an NMOS region and a PMOS region. The NMOS region comprises a first plurality of horizontal nanowires above a sub-fin. A first gate stack is over the plurality of nanowires and the sub-fin. First epitaxial source or drain structures are on opposite ends of the first plurality of horizontal nanowires. A PMOS region comprises a second plurality of horizontal nanowires above a sub-fin. A second gate stack is over the plurality of nanowires and the sub-fin. Second epitaxial source or drain structures are on opposite ends of the second plurality of horizontal nanowires. The first epitaxial source or drain structures and the second epitaxial source or drain structures have been substantially vertical opposing sidewalls and a top surface having a generally mushroom shape over a top of a dielectric layer.

Example embodiment 20: The computing device of embodiment 19, further comprising: a memory coupled to the board.

What is claimed is:

1. An integrated circuit structure, comprising:
   a plurality of nanowires above a sub-fin;
   a gate stack over the plurality of nanowires and the sub-fin; and
   epitaxial source or drain structures on opposite ends of the plurality of nanowires, the epitaxial source or drain structures having substantially vertical opposing sidewalls extending a height of the plurality of nanowires, and a substantially lateral wingspan that is symmetric around the plurality of nanowires such that a first distance from a left edge of the plurality of nanowires to a left edge of the epitaxial source or drain structures is substantially equal as a second distance from a right edge of the plurality of nanowires to a right edge of the epitaxial source or drain structures.

2. The integrated circuit structure of claim 1, wherein the epitaxial source or drain structures further include dislocations along the substantially vertical opposing sidewalls.

3. The integrated circuit structure of claim 1, wherein the substantially lateral wingspan is approximately 3-12 nm.

4. The integrated circuit structure of claim 1, wherein the epitaxial source or drain structures have a top surface above the height of the plurality of nanowires, the top surface having a generally mushroom shape.

5. The integrated circuit structure of claim 1, wherein the substantially lateral wingspan of the epitaxial source or drain structures is defined by a distance from an edge of the plurality of nanowires to an edge of the epitaxial source or drain structures.

6. The integrated circuit structure of claim 1, wherein the substantially lateral wingspan of the epitaxial source or drain structures is predefined by a thickness of a gate spacer.

7. The integrated circuit structure of claim 1, wherein the epitaxial source or drain structures are non-discrete epitaxial source or drain structures.

8. The integrated circuit structure of claim 1, wherein the epitaxial source or drain structures are discrete epitaxial source or drain structures.

9. A computing device, comprising:
   a board; and
   a component coupled to the board, the component including an integrated circuit structure, comprising:
   a plurality of nanowires above a sub-fin;
   a gate stack over the plurality of nanowires and the sub-fin; and
   epitaxial source or drain structures on opposite ends of the plurality of nanowires, the epitaxial source or drain structures having substantially vertical opposing sidewalls extending a height of the plurality of nanowires, and a substantially lateral wingspan that is symmetric around the plurality of nanowires such that a first distance from a left edge of the plurality of nanowires to a left edge of the epitaxial source or drain structures is substantially equal as a second distance from a right edge of the plurality of nanowires to a right edge of the epitaxial source or drain structures.

10. The computing device of claim 9, further comprising: a memory coupled to the board.

11. The computing device of claim 9, further comprising: a communication chip coupled to the board.

12. The computing device of claim 9, further comprising: a battery coupled to the board.

13. The computing device of claim 9, wherein the component is a packaged integrated circuit die.

14. An integrated circuit structure, comprising:
a plurality of fins having respective sub-fin portions in a substrate and respective active fin portions protruding from the substrate;
an isolation structure between and adjacent to the respective sub-fin portions of the plurality of fins;
a plurality of nanowires above a sub-fin; and
epitaxial source or drain structures on opposite ends of the plurality of fins, the epitaxial source or drain structures having substantially vertical opposing sidewalls extending a height of the plurality of nanowires, and a substantially lateral wingspan that is symmetric around the plurality of fins such that a first distance from a left edge of the plurality of fins to a left edge of the epitaxial source or drain structures is substantially equal as a second distance from a right edge of the plurality of fins to a right edge of epitaxial source or drain structures.

15. The integrated circuit structure of claim 14, wherein the epitaxial source or drain structures further include dislocations along the substantially vertical opposing sidewalls.

16. The integrated circuit structure of claim 14, wherein the substantially lateral wingspan is approximately 3-12 nm.

17. The integrated circuit structure of claim 14, wherein the epitaxial source or drain structures have a top surface above the height of the plurality of nanowires, the top surface having a generally mushroom shape.

18. A computing device, comprising:
a board; and
a component coupled to the board, the component including an integrated circuit structure, comprising:
an n-channel Metal-Oxide-Semiconductor (NMOS) region comprising;
a first plurality of horizontal nanowires above a first sub-fin;
a first gate stack over the first plurality of horizontal nanowires and the first sub-fin; and
first epitaxial source or drain structures on opposite ends of the first plurality of horizontal nanowires; and
a p-channel Metal-Oxide-Semiconductor (PMOS) region comprising;
a second plurality of horizontal nanowires above a second sub-fin;
a second gate stack over the second plurality of horizontal nanowires and the second sub-fin; and
second epitaxial source or drain structures on opposite ends of the second plurality of horizontal nanowires;
wherein the first epitaxial source or drain structures and the second epitaxial source or drain structures have substantially vertical opposing sidewalls extending a height of the first plurality of nanowires and the second plurality of nanowires, and a top surface above the height of the first plurality of nanowires and the second plurality of nanowires, respectively, the top surface having a generally mushroom shape.

19. The computing device of claim 18, further comprising:
a memory coupled to the board.

* * * * *